United States Patent [19]
Saito et al.

[11] 4,442,067
[45] Apr. 10, 1984

[54] MATERIAL FOR SEMICONDUCTOR HOLDER IN ELECTRON BEAM WRITING APPARATUS

[75] Inventors: Yoshinobu Saito; Sakae Sugimoto, both of Sendai, Japan

[73] Assignee: Tohoku Tokushuko Kabushiki Kaisha, Miyahiken, Japan

[21] Appl. No.: 449,623

[22] Filed: Dec. 14, 1982

[30] Foreign Application Priority Data

Dec. 22, 1981 [JP] Japan ................................. 56-207315

[51] Int. Cl.$^3$ ............................................ C22C 27/06
[52] U.S. Cl. ................................................... 420/428
[58] Field of Search ......................................... 420/428

[56] References Cited

U.S. PATENT DOCUMENTS 3,015,559 1/1962 McGurty et al. .................... 420/428
3,017,265 1/1962 McGurty et al. .................... 420/428
4,089,711 5/1978 Saito et al. .......................... 420/428

FOREIGN PATENT DOCUMENTS 54-26972 9/1979 Japan ................................. 420/428

Primary Examiner—L. Dewayne Rutledge
Assistant Examiner—Robert L. McDowell
Attorney, Agent, or Firm—Balogh, Osann, Kramer, Dvorak, Genova & Traub

[57] ABSTRACT

Material for semiconductor holder in electron beam writing apparatus is disclosed. The material consists of 1.0–11.0% by weight of iron, 0.2–5.5% by weight of Manganese, 0.0001–1.0% by weight of at least one rare earth element selected from rare earth elements, and remainder of chromium and inevitable impurity, the material having magnetic susceptibility of not more than $5 \times 10^{-5}$ emu/G and a thermal expansion coefficient of $0$–$4.0 \times 10^{-6}$/° C. at a temperature of 0° C.–40° C.

3 Claims, 2 Drawing Figures

MATERIAL FOR SEMICONDUCTOR HOLDER IN ELECTRON BEAM WRITING APPARATUS

BACKGROUND OF THE INVENTION

The present invention relates to a material for electron beam writing apparatus for forming very fine patterns with high precision, and more particularly to a material for a holder for supporting semiconductor chips used in electron beam writing apparatus.

The integration degree of IC has rapidly been densified and developed toward a real age of super LSI or very large scale integrated, while each kind of fine pattern forming techniques has been developed actively.

Among these techniques, an electron beam writing apparatus excels other methods in small minimum dimension of beams, writing speed and cost.

In the fine pattern forming techniques, however, it is necessary to limit a pattern line width to less than 1.0 μm and writing precision to less than 0.1 μm, and the material is further required to have an extremely small dimension change due to temperature and non-magneticity and more particularly good conductivity in the case of work stage system. The reason why the non-magnetism is required is because if a magnetic field is generated in the electron beam writing apparatus, a dimension change, disturbance and absorption of electron beams due to magnetostriction are produced to make the apparatus unusable.

As material for electron beam writing apparatus, use is exclusively made of high Al alloy close to pure Al, and this alloy is preferable in the point of having non-magnetism and good conductivity, but its thermal expansion coefficient is large such as $23 \times 10^{-6}$, so that in order to avoid a slight dimension change due to temperature in use, a temperature should strictly be controlled to $\pm 0.1°$ C. particularly in work stage and lens systems. However, even if the temperature control is strictly managed, in the case of a cassette for holding a stage system or mask, it is difficult to prevent a temperature rise due to heat generation during writing with electron beams.

There has not been known any material, satisfying all the three properties, non-magneticity, small thermal expansion coefficient and good thermal conductivity, for semiconductor holder used in the electron beam writing apparatus.

SUMMARY OF THE INVENTION

It is an object of the present invention to eliminate the above described disadvantages inherent to the hitherto used material for semiconductor holder used in the electron beam writing apparatus.

It is another object of the present invention to provide material for semiconductor holder for use in an electron beam writing apparatus capable of attaining the above object.

According to the present invention there is provided material for semiconductor holder in electron beam writing apparatus consisting of 1.0–11.0% by weight of iron, 0.2–5.5% by weight of manganese, 0.0001–1.0% by weight of at least one rare earth element selected from rare earth elements, and remainder of chromium and inevitable impurity, the material having magnetic susceptibility of not more than $5 \times 10^{-5}$ emu/g and a thermal expansion coefficient of $0–4.0 \times 10^{-6}/°$C. at a temperature of 0° C.–40° C.

BRIEF DESCRIPTION OF THE DRAWINGS

The invention will now be described with reference to the accompanying drawings, wherein.

DETAILED DESCRIPTION OF THE INVENTION

The present inventors considered such facts that the Al alloy material used as material for semiconductor holder used in the electron beam writing apparatus includes excellent properties such as non-magetism and good conductivity but also includes large thermal expansion coefficient, so that the material has a limit for forming a fine pattern with high precision and is poor at reliability, and as a result, it becomes a great obstacle in development of ultra LSI. The present inventors started to study and develop material including all of the above various properties as a material for semiconductor holder used in electron beam writing apparatus. After various experiments, the inventors have found an optimum material and completed the invention; namely, to a material consisting of Fe 1.0–11.0%, Mn 0.2–5.5% and the remainder Cr and inevitable impurities is added a rare earth element 0.0001–1.0%, thereby obtaining an alloy having magnetic susceptibility of $10 \times 10^{-5}$ emu/g and thermal expansion coefficient of less than $0–4.0 \times 10^{-6}/°$C. in a temperature range of 0° C.–40° C.

Figure 1:
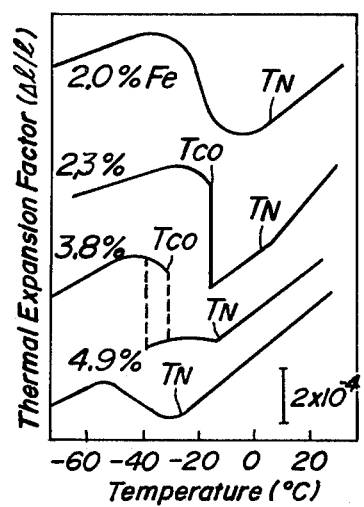
FIG. 1 is a graph showing thermal expansion curves Cr-Fe based binary system primary solid solution alloys.
Figure 2:
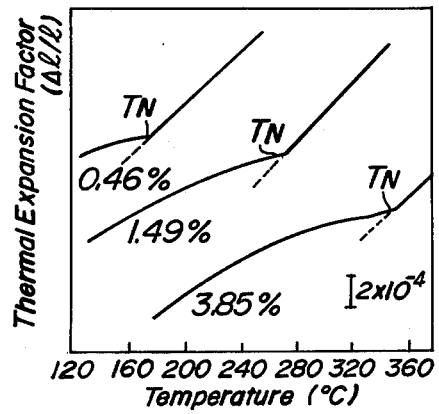
FIG. 2 is a graph showing thermal expansion curves of Cr-Mn based binary system primary solid solution alloys.

As is well known, Cr is anti-ferromagnetic metal having special spin orientation, which Neel point showing paramagnetisum-antiferromagnetism transformation is about 40° C., and at the Neel point an abnormal change is produced in physical properties, particularly thermal expansion, elasticity, electric resistance and the like. In addition, when other elements are added to Cr, physical properties are variously changed. FIG. 1 shows a thermal expansion curves of Cr-Fe-series solid solution alloy, in which there exists a temperature region where thermal expansion becomes extremely small in the vicinity of Neel temperature (TN). However, the temperature region is very low. On the other hand, in Cr-Mn series alloy, as shown in thermal expansion curves in FIG. 2, thermal expansion becomes small at less than TN, but such temperature region having small thermal expansion is on the side of high temperature contrary to the Cr-Fe series alloy.

The invention is based on novel knowledge that Cr-Fe-Mn three element series alloy obtained by combining a component composition of Cr-Fe series and Cr-Mn series shows extremely small thermal expansion in the vicinity of a room temperature and so far superior material to those hitherto used as material for semiconductor holder used in the electron beam writing apparatus.

The reason why the component composition of the material is limited in the invention is explained as follows.

If Fe is less than 1.0% or Mn is less than 0.2%, a thermal expansion coefficient of the material shows a negative value, particularly in case of using a mask substrate cassette and the like, excessive compression is applied to the mask owing to a local temperature rise with electron beam exposure, and as a result, there is a risk of damaging the mask sometimes, while if Fe is more than 11.0% or Mn is more than 5.5%, the thermal expansion coefficient becomes more than $4.0 \times 10^{-6}/°C$., and an error caused by a temperature rise is produced, so that it is necessary to limit Fe and Mn within a range of 1.0-11.0% and 0.2-5.5%, respectively.

Rare earth element has strong deoxidation and denitrization actions, and an addition of said element improves workability and makes the manufacture of an electron beam writing apparatus easy, but if the rare earth element is less than 0.0001%, an improving effect of the workability cannot be obtained, while if the rare earth element is more than 1.0%, the element becomes a simple substance or eutectic, disperses into the grain boundary or grains, results in cracks in hot working, and deteriorates surface precision on the outermost surface, so that it is necessary to limit the rare earth element within a range of 0.0001-1.0%.

Susceptibility x is less than $5 \times 10^{-5}$ emu/gr when Fe, Mn and rare earth element are within the limit range, which is less than 1/10 the susceptibility $50 \times 10^{-5}$ emu/gr of common non-magnetic austenite stainless steel (18 Cr-8 Ni) and is entirely non-magnetic in practice, so that there is shown no dimension change with magnetic strain due to the magnetic field nor disturbance or absorption of electron beams.

Thermal expansion coefficient $\alpha$ is $0-4.0 \times 10^6/°C$. when Fe, Mn and rare earth element are within the limit range, which is about 1/6 the substrate Al ($\alpha: 23 \times 10^{-6}/°C$.) of commonly used electron beam writing apparatus and is excellent for improving mask precision.

In the material according to the invention, a material consisting of Fe 3.0-7.0%, Mn 0.2-1.5%, 0.001-1.0% of at least one selected from rare earth elements, the remainder Cr and inevitable impurities has susceptibility of less than $3.5 \times 10^{-5}$ emu/g and thermal expansion coefficient of $0-2.5 \times 10^{-6}/°C$. at a temperature of 0° C. to 40° C. The above material has excellent properties for semiconductor holder used in electron beam writing apparatus.

In the material according to the invention, the material consisting of Fe 3.0-5.0%, Mn 0.3-0.5%, 0.2-1.0% of at least one selected from rare earth elements, the remainder Cr and inveitable impurities has susceptibility of less than $2.0 \times 10^{-5}$ emu/g and thermal expansion coefficient of $0-0.5 \times 10^{-6}/°C$. at a temperature of 0° C. to 40° C. This material has most excellent properties as a material for electron beam writing apparatus.

EXAMPLE 1

Ten kinds of anti-ferromagnetic Cr based invar alloy consisting of Fe 1.0-10%. Mn 0.2-6.0% and the remainder Cr were solved to about 2 kg in an induction furnace of an Ar atmosphere, 2% of La was added and refined, and thereafter obtained an ingot of $\phi$40 mm×1.

Each ingot was hot worked up to a working ratio 5 at a temperature of 1250° C.-1300° C. and a sample of $\phi$5 mm×1 50 mm was cut out. Each sample was annealed for 1 hour at 1100° C. in vacuum and their thermal expansion coefficients were measured. Susceptibility was also measured by annealing cutting dust at 1100° C. in vacuum.

Table 1 shows chemical components each sample, mean thermal expansion coefficient at 0°-40° C. and susceptibility at room temperature.

All the alloys show very small thermal expansion coefficient of less than $4.0 \times 10^{-6}/°C$. and susceptibility of less than $2 \times 10^{-5}$ emu/g.

TABLE 1

| | Chemical components | | | | Physical properties | |
|---|---|---|---|---|---|---|
| | | | | | Thermal expansion coefficient | Susceptibility |
| No. | Fe (%) | Mn (%) | La (%) | Cr (%) | $\alpha_{0-40°}$ C. × $10^{-6}/°C$. | $x_{23°}$ C. × $10^{-5}$emu/gr |
| 1 | 1.67 | 1.45 | 0.0001 | Bal | 4.0 | 0.6 |
| 2 | 3.09 | 0.37 | 0.0001 | Bal | 0 | 0.8 |
| 3 | 3.12 | 1.36 | 0.0001 | Bal | 3.6 | 0.8 |
| 4 | 5.02 | 1.03 | 0.0001 | Bal | 1.0 | 1.2 |
| 5 | 5.87 | 0.35 | 0.002 | Bal | 0.5 | 1.1 |
| 6 | 6.18 | 1.05 | 0.001 | Bal | 1.2 | 1.1 |
| 7 | 5.22 | 1.38 | 0.001 | Bal | 2.5 | 1.2 |
| 8 | 6.02 | 3.64 | 0.001 | Bal | 4.0 | 1.4 |
| 9 | 7.98 | 3.21 | 0.01 | Bal | 3.0 | 1.4 |
| 10 | 9.57 | 5.18 | 0.02 | Bal | 4.0 | 1.4 |

EXAMPLE 2

Anti-ferromagnetic Cr based invar alloy of Cr-Fe-Mn system was solved to 80 kg in the induction furnace of an Argon atmosphere, to which was added 3.5-5.0 wt% of La or Mischmetal (40-50% Ce, 35-45% La 5-10% Fe and others) and refined, thereafter obtained an ingot of 150 mm×150 mm×1.

Each ingot was hot worked up to a working ratio of 5 at a temperature of 1300° C., a sample of $\phi$5 mm×1 50 mm was cut off, annealed in vacuum and thermal expansion was measured.

As shown in Table 2, allows formed by solution in industrial scale and alloys having slight remainder of rare earth element have small change of thermal expansion coefficient and very low thermal expansion was shown. In addition, if the residual amount of La and mischmetal is less than 1%, there is found no simple substance or eutectic of the rare earth element in structure of the alloy.

TABLE 2

| | Chemical components | | | | | Thermal expansion coefficient |
|---|---|---|---|---|---|---|
| No. | Fe (%) | Mn (%) | La (%) | Mischmetal (%) | Cr (%) | $\alpha_{0-40°}$ C.× $^{-6}/°C$. |
| 11 | 4.89 | 1.02 | 0.19 | — | Bal | 1.2 |
| 12 | 4.34 | 1.01 | 0.43 | — | Bal | 1.0 |
| 13 | 5.68 | 0.98 | — | 0.06 | Bal | 1.2 |
| 14 | 5.03 | 0.51 | — | 0.24 | Bal | 0.5 |

EXAMPLE 3

Anti-ferromagnetic Cr based invar alloy of Cr-5.5. and Fe-0.98 was solved to 100 kg in the induction furnace of an Argon atmosphere, added metal La of 3.5% by weight (residual amount: 0.056%), refined and obtained an ingot of 150 mm×150 mm×1. This ingot was forged to $\phi$20 mm by hot press. Thermal expansion coefficient $\alpha$ and susceptibility x of a sample cut out of the forged ingot were examined, and the result is as shown in Table 3, that is, thermal expansion coefficient and susceptibility are excellent. In addition, the sample was mechanically worked to a shape for a mask cassette without any problem. As compared with the prior material, the material according to the invention is excellent in aging.

TABLE 3

| | Thermal expansion coefficient $\alpha \times 10^{-6}/°C.$ | Susceptibility $x \times 10^{-6} emu/gr$ |
|---|---|---|
| Alloy according to the invention | 1.0 | 1.2 |

As described above, the material according to the invention is superior to the prior ones as a material for semiconductor holder used in the electron beam writing apparatus and can greatly contribute to development of electronic industry.

What is claimed is:

1. Material for semiconductor holder in electron beam writing apparatus consisting of 3.0-7.0% by weight of iron, 0.2-less than 1.5% by weight of manganese, 0.001-1.0% by weight of at least one rare earth element, and remainder of chromium and inevitable impurity, said material having magnetic susceptibility of not more than $3.5 \times 10^{-5}$ emu/g and a thermal expansion coefficient of $0-2.5 \times 10^{-6}/°C.$ at a temperature of 0° C.-40° C.

2. Material for semiconductor holder in electron beam writing apparatus as claimed in claim 1, wherein the material consists of 3.0-5.0% by weight of iron, 0.3-0.5% by weight of manganese, 0.2-1.0% by weight of at least one rare earth element, and remainder of chromium and inevitable impurity, the material having magnetic susceptibility of not more than $2.0 \times 10^{-5}$ emu/g, and a thermal expansion coefficient of $0-0.5 \times 10^{-6}/°C.$ at a temperature of 0° C.-40° C.

3. Material for semiconductor holder in electron beam writing apparatus as claimed in claim 2, wherein said rare earth element is selected from the group consisting of lanthanum, yttrium, cerium, praseodymium, samarium, europium, gadolinium, and dysprosium.

* * * * *